(12) United States Patent
Mu et al.

(10) Patent No.: US 12,291,771 B2
(45) Date of Patent: *May 6, 2025

(54) MASK DEVICE AND EVAPORATION DEVICE

(71) Applicants: Wuhan Tianma Micro-Electronics Co., Ltd., Wuhan (CN); Wuhan Tianma Micro-Electronics Co., Ltd. Shanghai Branch, Shanghai (CN)

(72) Inventors: Naichao Mu, Wuhan (CN); Yuan Li, Wuhan (CN); Yu Xin, Wuhan (CN); Jun Ma, Wuhan (CN); Lijing Han, Wuhan (CN)

(73) Assignees: Wuhan Tianma Micro-Electronics Co., Ltd., Wuhan (CN); Wuhan Tianma Micro-Electronics Co., Ltd. Shanghai Branch, Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/525,005

(22) Filed: Nov. 30, 2023

(65) Prior Publication Data

US 2024/0093349 A1 Mar. 21, 2024

Related U.S. Application Data

(63) Continuation of application No. 15/888,104, filed on Feb. 5, 2018, now Pat. No. 11,885,004.

(30) Foreign Application Priority Data

Sep. 8, 2017 (CN) .......................... 201710807064.6

(51) Int. Cl.
*C23C 14/04* (2006.01)
*C23C 14/12* (2006.01)

(52) U.S. Cl.
CPC ............ *C23C 14/042* (2013.01); *C23C 14/12* (2013.01)

(58) Field of Classification Search
None
See application file for complete search history.

(56) References Cited

U.S. PATENT DOCUMENTS 10,868,268 B2    12/2020  Kim et al.
11,885,004 B2 *  1/2024   Mu ........................ C23C 14/042
                          (Continued)

FOREIGN PATENT DOCUMENTS

CN       203960317 U    11/2014
CN       107523786 A    12/2017
KR    1020150078272 A    7/2015

*Primary Examiner* — Jeffrie R Lund
*Assistant Examiner* — Tiffany Z Nuckols
(74) *Attorney, Agent, or Firm* — Anova Law Group, PLLC

(57) ABSTRACT

A mask module includes a framework, a first strip plate fixed on the framework and extending along a first direction, and a first mask. The first mask is located on a side, deviating from the framework, of the first strip plate. The first mask includes at least one preset area, and the preset area includes at least one opening area. The first strip plate is provided with a first concave-convex structure on one side edge along the first direction. At least one convex structure is provided in a middle of the first concave-convex structure along the first direction. In a direction perpendicular to a surface of the first mask, the first concave-convex structure and the convex structure cover at least a part of area of the at least one opening area of the preset area. The convex structure and the first strip plate are integrally formed.

20 Claims, 18 Drawing Sheets

(56) References Cited

U.S. PATENT DOCUMENTS

| | | |
|---|---|---|
| 2009/0291203 A1 | 11/2009 | Hagi et al. |
| 2011/0168087 A1 | 7/2011 | Lee et al. |
| 2014/0000792 A1 | 1/2014 | Ko et al. |
| 2015/0101536 A1 | 4/2015 | Han |
| 2016/0001542 A1 | 1/2016 | Saito et al. |
| 2017/0141313 A1 | 5/2017 | Min |
| 2017/0207390 A1 | 7/2017 | Kim et al. |
| 2017/0222145 A1 | 8/2017 | Kim |
| 2018/0040857 A1 | 2/2018 | Hong et al. |

\* cited by examiner

MASK DEVICE AND EVAPORATION DEVICE

CROSS-REFERENCE TO RELATED APPLICATIONS

This application is a continuation of U.S. patent application Ser. No. 15/888,104, filed on Feb. 5, 2018, which claims the benefit of Chinese Patent Application No. CN 201710807064.6, filed with the Chinese Patent Office on Sep. 8, 2017, which is hereby incorporated by reference in its entirety.

FIELD

The present disclosure relates to the technical field of the manufacturing of Organic Light-Emitting Diode (OLED) display devices, and particularly to a mask device and an evaporation device.

BACKGROUND

Owing to such advantages as thinness, light weight, wide viewing angle, active emitting, continuous adjustment of emitting colors, low cost, high response speed, low power consumption, low drive voltage, wide range of operating temperature, simple production process, high luminous efficiency and flexible display, the OLED display panel has been listed as the next-generation display technology with great development prospects.

When the OLED display panel is manufactured, multiple layer structures need to be manufactured by adopting an evaporation process. When the evaporation process is conducted, an evaporation mask needs to be used as an evaporation mask film to form an evaporation pattern on the evaporation target. Along with the development of the OLED technology, the display device gradually tends to be provided with a narrow border or even with no border. In consideration of beauty and product quality, the display panel is no longer limited to regular shapes like a rectangle, and special-shaped display panels have gradually appeared in people's field of vision.

In the prior art, compared with the existing mask with the evaporation area being of a regular shape, when the special-shaped display panel is manufactured, the evaporation area of the mask used in the evaporation process also needs to be a special-shaped evaporation area, then the cost for manufacturing the mask is higher. Therefore, how to reduce the cost of the mask used when a special-shaped display panel is manufactured is a technical problem needing to be solved urgently.

SUMMARY

Embodiments of the present disclosure provide for a mask device and an evaporation device, so as to manufacture a special-shaped display panel and improve the manufacturing efficiency of the special-shaped display panel.

Embodiments of the present disclosure provide a mask module, including a framework, a first strip plate fixed on the framework and extending along a first direction, and a first mask. The first mask is located on a side, deviating from the framework, of the first strip plate. The first mask includes at least one preset area, and the preset area includes at least one opening area. The first strip plate is provided with a first concave-convex structure on one side edge along the first direction. At least one convex structure is provided in a middle of the first concave-convex structure along the first direction. In a direction perpendicular to a surface of the first mask, the first concave-convex structure and the convex structure cover at least a part of area of the at least one opening of the preset area. The convex structure and the first strip plate are integrally formed.

Embodiments of the present disclosure provide an evaporation device, including an evaporation source and a mask module. The mask module includes a framework, a first strip plate fixed on the framework and extending along a first direction, and a first mask. The first mask is located on a side, deviating from the framework, of the first strip plate. The first mask includes at least one preset area, and the preset area includes at least one opening area. The first strip plate is provided with a first concave-convex structure on one side edge along the first direction. At least one convex structure is provided in a middle of the first concave-convex structure along the first direction. In a direction perpendicular to a surface of the first mask, the first concave-convex structure and the convex structure cover at least a part of area of the at least one opening of the preset area. The convex structure and the first strip plate are integrally formed. The evaporation source sends evaporation substances towards the mask module, and the evaporation substances are evaporated to evaporation targets through the mask module.

DETAILED DESCRIPTION OF THE EMBODIMENTS

In order to manufacture a special-shaped display panel and improve the manufacturing efficiency of the special-shaped display panel, the embodiments of the present disclosure provide a mask device and an evaporation device.

Figure 1:
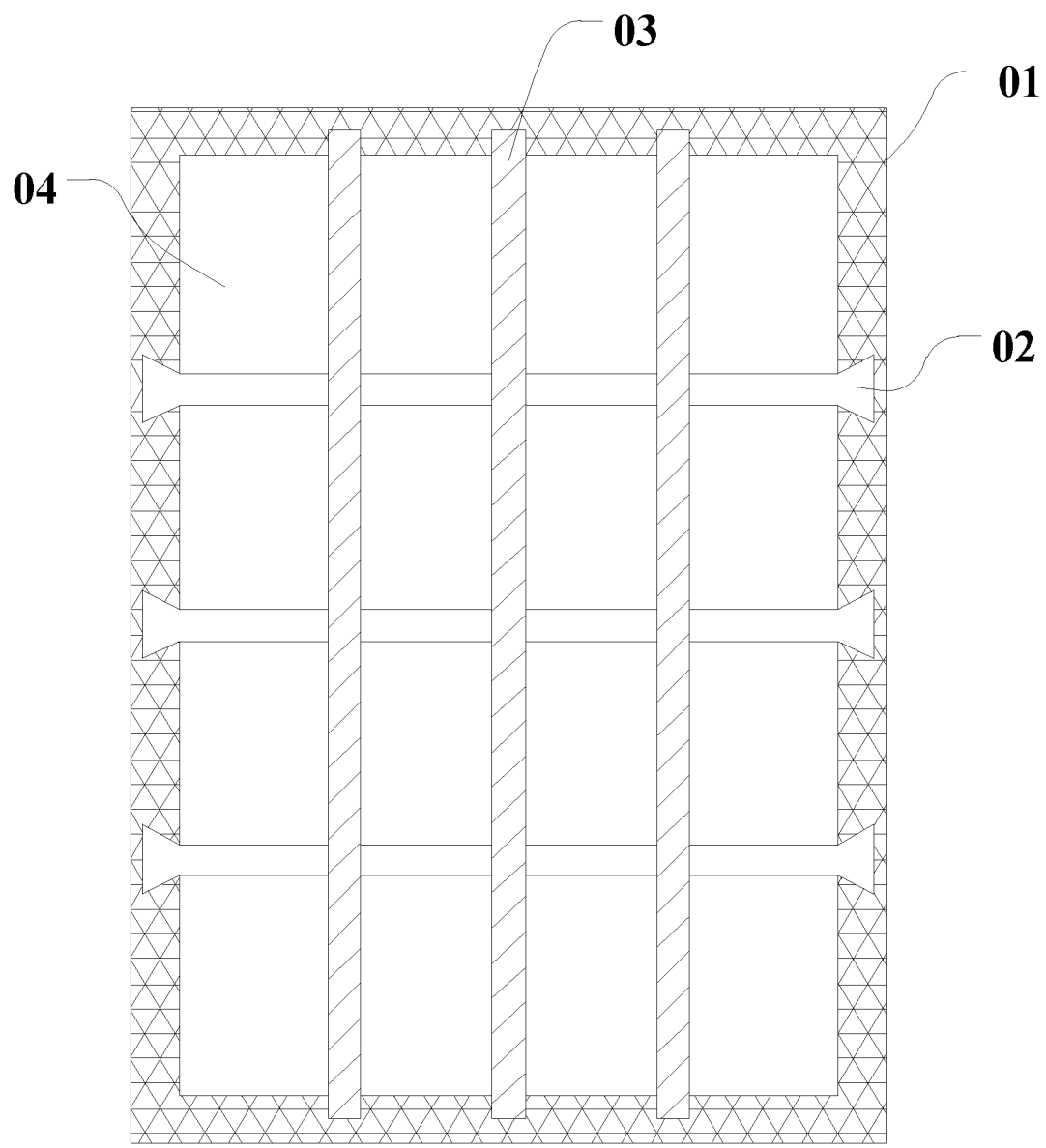
FIG. 1 is a structural schematic diagram of a mask device.
Figure 2:
FIG. 2 is a structural schematic diagram of a first strip plate.
Figure 3:
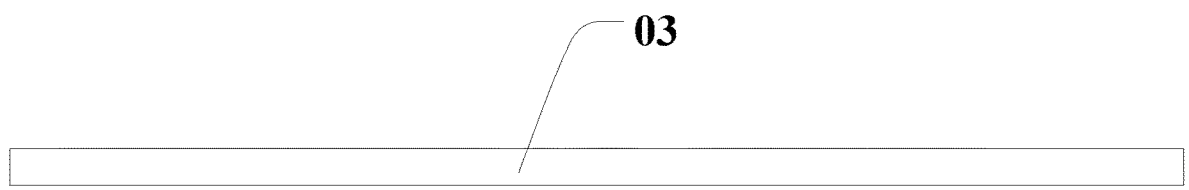
FIG. 3 is a structural schematic diagram of a second strip plate.

Please refer to FIG. 1 to FIG. 3, in the related art, the structure of the mask device usually includes a framework 01 and a first strip plate 02 and a second strip plate 03 fixed on the framework 01, where the first strip plate 02 and the second strip plate 03 respectively extend along the first direction and the second direction, the first direction and the second direction are intersected with each other. As shown in FIG. 2 and FIG. 3, the first strip plate 02 and the second strip plate 03 are both of a cube strip structure, therefore, the evaporation areas 04 formed by the intersection between the first strip plate 02 and the second strip plate 03 are all regular rectangular areas, and are not suitable for manufacturing special-shaped display panels.

Figure 4:
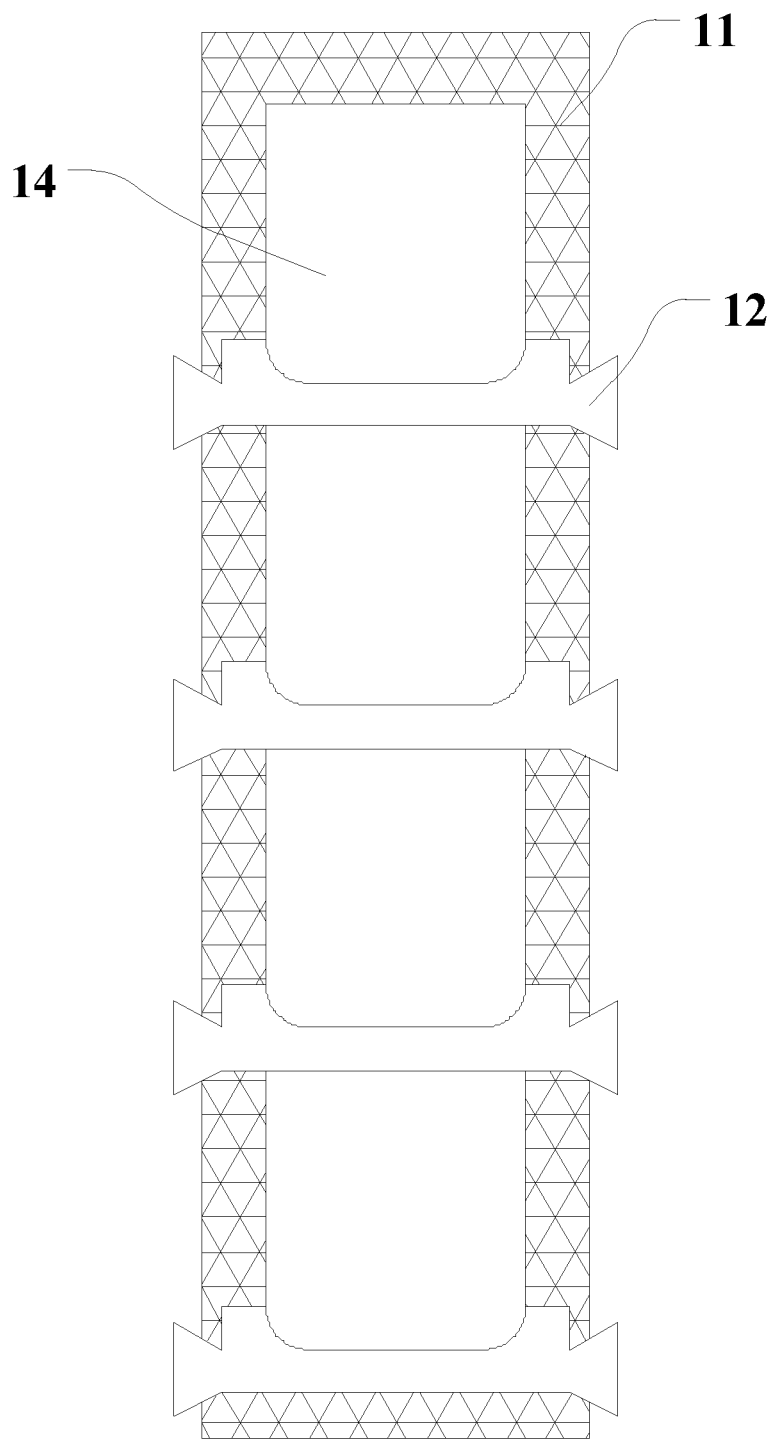
FIG. 4 is a structural schematic diagram of a mask device in a first embodiment of the present disclosure.
Figure 5:
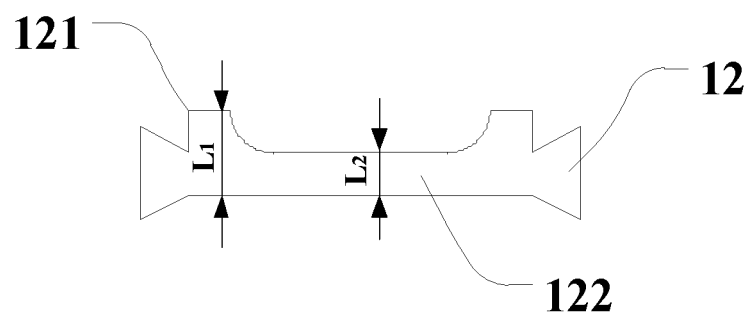
FIG. 5 is a structural schematic diagram of a first strip plate in a second embodiment of the present disclosure.

As shown in FIG. 4 and FIG. 5, a mask device provided by an embodiment of the present disclosure includes a framework 11 and a first strip plate 12, and the first strip plate 12 is fixed on the framework 11 and extends along a first direction, where the first strip plate 12 includes a first area 121 and a second area 122, the width of the first area 121 is greater than the width of the second area 122 in the direction parallel to the surface of the first strip plate 12 and vertical to the first direction.

In the embodiment, the first strip plate 12 of the mask device includes a first area 121 and a second area 122 which are of different widths. Please refer to FIG. 5, the width of the first area 121 of the first strip plate is $L_1$, the width of the second area 122 is $L_2$, and $L_1 > L_2$. Specifically, the shape of the first strip plate 12 may be designed based on the shape structure of the special-shaped display panel to be evaporated. The adjacent first strip plates 12 and the framework 11 form a special-shaped evaporation area 14 to manufacture a special-shaped display panel. The position with no need of evaporation may be opposite to the first area 121, a special-shaped evaporation pattern may be formed through a one-time evaporation process by designing the position and shape of the first area 121 and the second area 122 reasonably, thus the efficiency of manufacturing the special-shaped display panel is high, and the cost is saved.

Where the fixed manner between the first strip plate 12 and the framework 11 is not limited, for example, the first strip plate 12 and the framework 11 may be connected in a welding or bonding manner, or may also be of an integrated structure.

Figure 6:
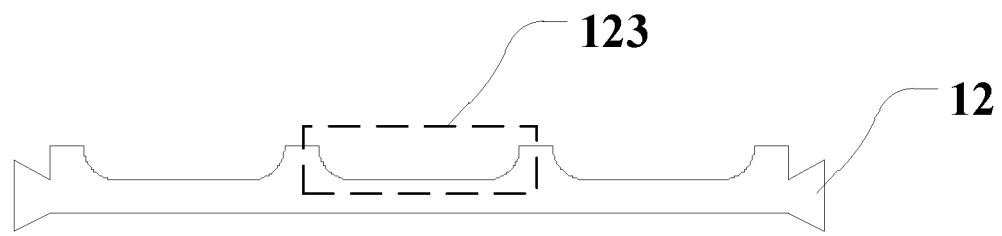
FIG. 6 is a structural schematic diagram of a first strip plate in a third embodiment of the present disclosure.
Figure 7:
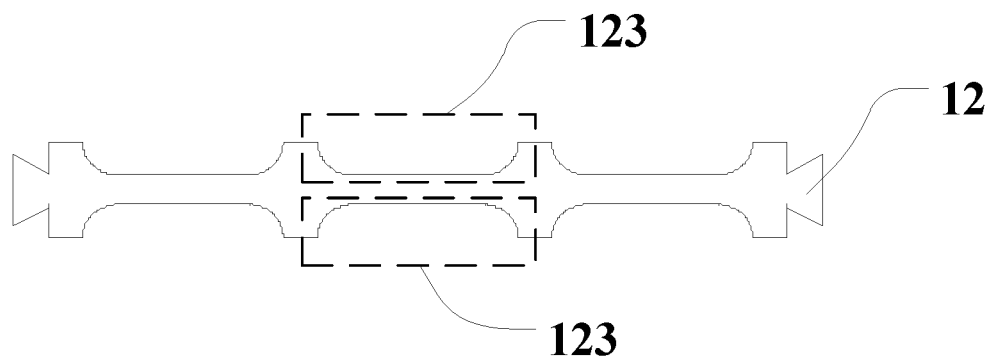
FIG. 7 is a structural schematic diagram of a first strip plate in a fourth embodiment of the present disclosure.

Please refer to FIG. 6 and FIG. 7. In one embodiment, the first strip plate 12 is provided with a first concave-convex structure 123 on a side edge along the first direction.

In the embodiment, as shown in FIG. 6, the first strip plate 12 may be provided with a first concave-convex structure 123 on one side edge along the first direction, and as shown in FIG. 7, the first strip plate 12 may also be provided with a first concave-convex structure 123 on both side edges along the first direction. In one embodiment, when the two side edges of the first strip plate 12 are both provided with a first concave-convex structure 123, the first concave-convex structure 123 on two side edges are arranged in mirror symmetry. The number of the first concave-convex structures 123 included in each first strip plate 12 is not specifically limited, and may be one, two or more. Specifically, the numbers of the concave parts and convex parts included in each concave-convex structure 123 are also not specifically limited. The first concave-convex structure 123 of the first strip structure as shown in FIG. 6 and FIG. 7 may be deemed to include two convex parts and a concave part.

Figure 8:
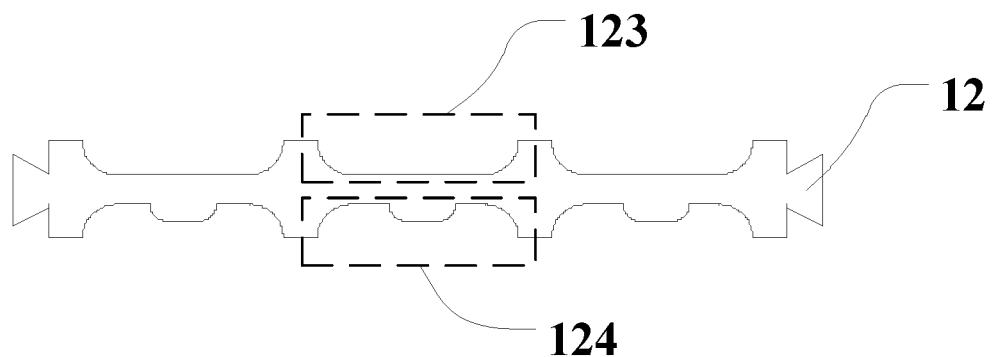
FIG. 8 is a structural schematic diagram of a first strip plate in a fifth embodiment of the present disclosure.

Please refer to FIG. 8. In another embodiment, the first strip plate 12 is provided with a first concave-convex structure 123 on one side edge along the first direction, and provided with a second concave-convex structure 124 on the other side edge.

In the embodiment, the specific patterns of the first concave-convex structure 123 and the second concave-convex structure 124 may be the same and may also be different. Please refer to FIG. 9, in the specific application process, the first concave-convex structure 123 of one first strip plate 12 and the second concave-convex structure 124 of an adjacent first strip plate 12 correspond to two sides of the same special-shaped evaporation area 14, thereby constituting an entire special-shaped evaporation area 14. Therefore, the patterns of the first concave-convex structure 123 and the second concave-convex structure 124 may be made different based on requirements.

Figure 10:
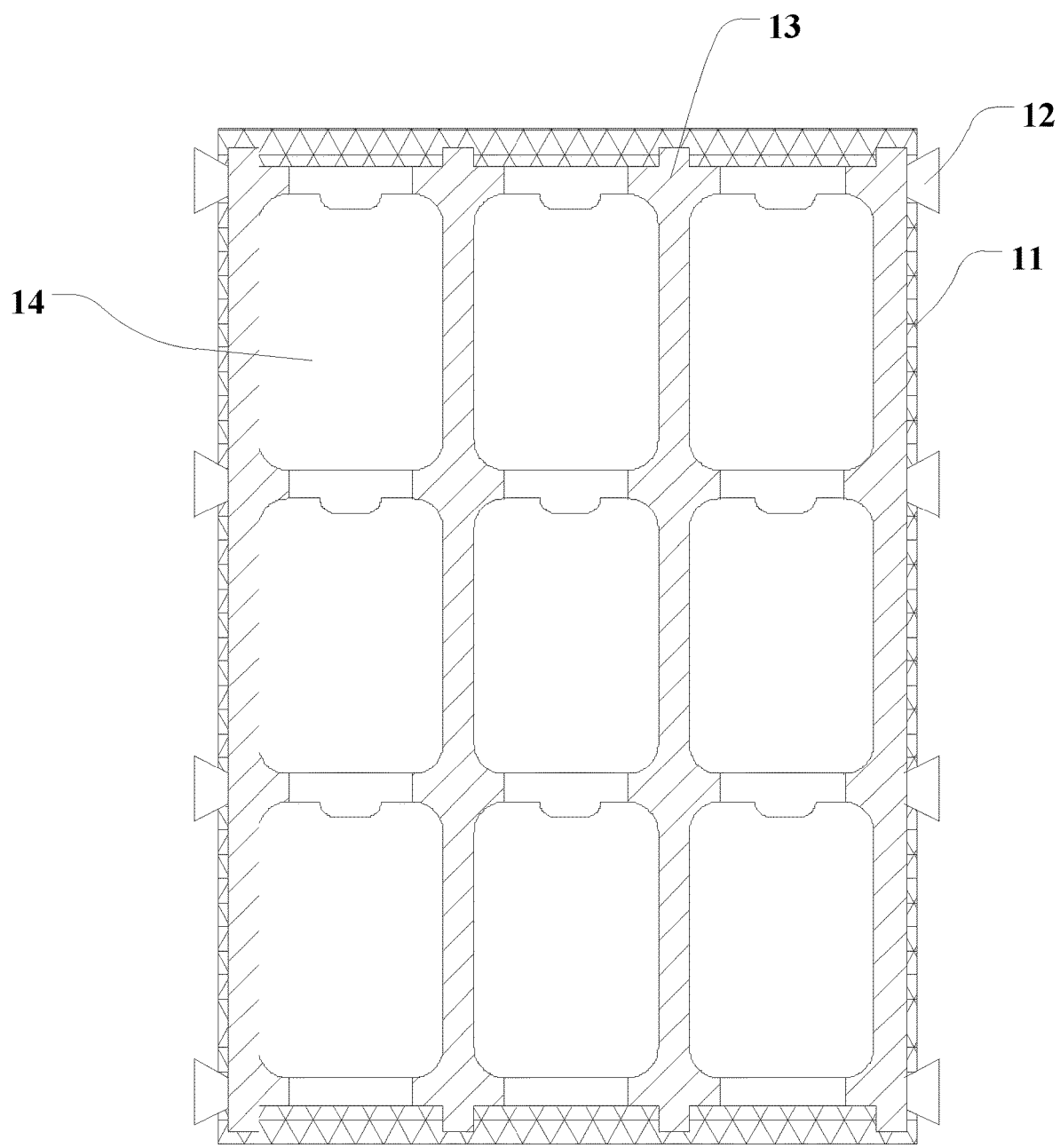
FIG. 10 is a structural schematic diagram of a mask device in a seventh embodiment of the present disclosure.
Figure 11:
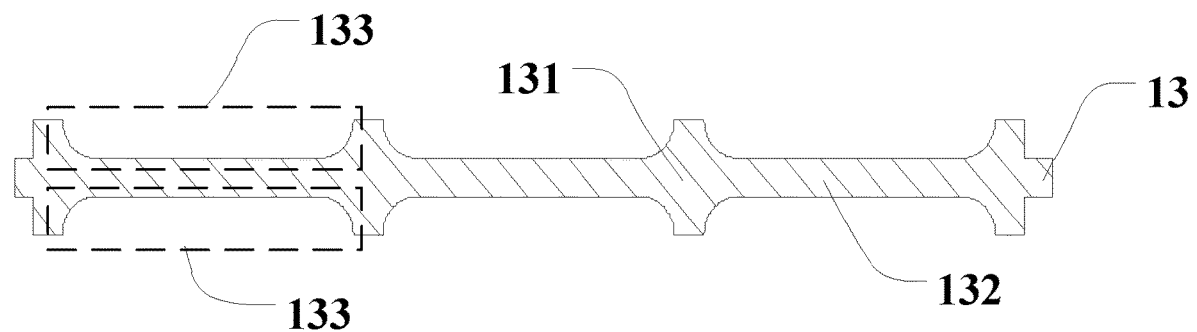
FIG. 11 is a structural schematic diagram of a second strip plate in an eighth embodiment of the present disclosure.

Please refer to FIG. 10 and FIG. 11. In one embodiment, the mask device further includes a second strip plate 13 fixed on the framework 11, where the second strip plate 13 extends along the second direction, and the first direction is intersected with the second direction; the second strip plate 13 includes a third area 131 and a fourth area 132, and the width of the third area 131 is greater than the width of the fourth area 132 in the direction parallel to the surface of the second strip plate 13 and vertical to the second direction.

In the embodiment, the first strip plate 12 is intersected with the second strip plate 13 to form a special-shaped evaporation area 14, the second strip plate 13 includes a third area 131 and a fourth area 132 with different widths, then the shape of the second strip plate 13 may be designed according to the shape structure of the display panel to be evaporated. In the embodiment, the shapes of the first strip plate 12 and the second strip plate 13 may be adjusted based on product requirements, such that the periphery of the display panel may be designed with a special-shaped structure based on requirements, thereby improving the flexibility of the special-shaped display panel, and furthermore, the complex special-shaped evaporation patterns may also be manufactured through a one-step evaporation process, thereby further improving the efficiency of manufacturing the special-shaped display panel.

In some embodiments, the fixed manner between the second strip plate 13, the first strip plate 12 and the framework 11 is also not limited, they may be connected in a welding or bonding manner or may be of an integrated structure; or the first strip plate 12 and the second strip plate 13 may be respectively welded with the framework 11, while the first strip plate 12 is connected with the second strip plate 13 in an inserting manner; or, the first strip plate 12 and the second strip plate 13 are integrally formed, and then the first strip plate 12 and the second strip 13 are welded with the framework 11, or the connection manner between each part may be designed based on the manufacturing process and the product requirements.

Please continue to refer to FIG. 11. The second strip plate 13 is provided with a third concave-convex structure 133 on the side edge along the second direction.

In the embodiment, similar to the structure of the first strip plate 12, the second strip plate 13 may be provided with a third concave-convex structure 133 on one side edge along the second direction, and may also be provided with a third concave-convex structure 133 on both side edges along the second direction. In one embodiment, as shown in FIG. 11, when the two side edges of the second strip plate 13 are both provided with a third concave-convex structure 133, the third concave-convex structures 133 on the two side edges are arranged in mirror symmetry. The number of the third concave-convex structure 133 included in a side edge of each second strip plate 13 is not specifically limited, and may be one, two or more. In one embodiment, the numbers of the concave parts and convex parts included in each third concave-convex structure 133 are also not specifically limited. The second strip plate 13 as shown in FIG. 11 may be deemed to include two convex parts and a concave part.

Figure 12:
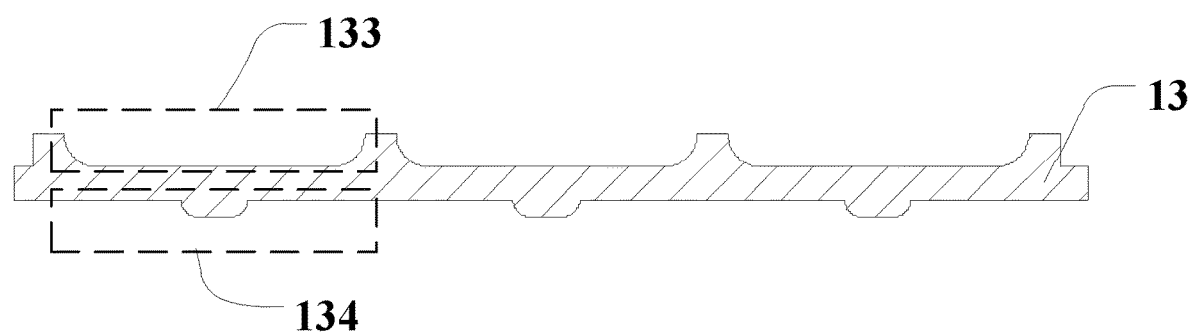
FIG. 12 is a structural schematic diagram of a second strip plate in a ninth embodiment of the present disclosure.

Please refer to FIG. 12. In another specific embodiment, the second strip plate 13 is provided with a third concave-convex structure 133 on one side edge along the second direction, and provided with a fourth concave-convex structure 134 on the other side edge.

In the embodiment, the specific patterns of the third concave-convex structure 133 and the fourth concave-convex structure 134 may be the same and may also be different. As shown in FIG. 12, the specific patterns of the third concave-convex structure 133 and the fourth concave-convex structure 134 are different.

In specific application process, a third concave-convex structure 133 of a second strip plate 13 and the fourth concave-convex structure 134 of an adjacent second strip plate 13 correspond to the two sides of the same special-shaped evaporation area 14. Furthermore, the third concave-convex structure 133 and the fourth concave-convex structure 134 as well as the first concave-convex structure 123 and the second concave-convex structure 124 of the first strip plate 12 may constitute an entire special-shaped evaporation pattern together. Therefore, the first concave-convex structure 123, the second concave-convex structure 124, the third concave-convex structure 133 and the fourth concave-convex structure 134 may be designed respectively according to requirements.

Please continue to refer to FIG. 10. In one embodiment, the mask device includes multiple first strip plates 12 and multiple second strip plates 13, and the first strip plates 12 and the second strip plates 13 are intersected with each other to define multiple areas.

In the embodiment, the first strip plate 12 and the second strip plate 13 are both multiple in number, then multiple special-shaped evaporation areas 14 may be defined, and multiple special-shaped display panels may be evaporated in the one-step evaporation process by utilizing the mask device, thereby further improving the efficiency of manufacturing special-shaped display panels.

In one embodiment, the first strip plate 12 and the second strip plate 13 are integrally formed. A mask device may be formed by fixing the first strip plate 12 and the second strip plate 13 which are integrated on a framework 11, then the efficiency of manufacturing the mask device may be improved, the integrality of the mask device may be improved, and further the evaporation effect of utilizing the mask device for evaporation is improved.

Please refer to FIG. 6. In an optional embodiment, the first concave-convex structure 123 includes an arc-shaped structure at two ends of the first concave-convex structure along the first direction.

In some embodiments, the arc-shaped structure in the embodiment is a concave arc structure, and the correspondingly formed special-shaped evaporation area 14 may form a rounded angle in the angular position, so as to manufacture a special-shaped display panel with a rounded angle structure.

In addition, please refer to FIG. 8, the second concave-convex structure 124 in the above embodiment may also include an arc-shaped structure at two ends of the second concave-convex structure 124 along the first direction. In actual application, please refer to FIG. 9, the four angular positions of the evaporation area 14 constituted by two adjacent first strip plates 12 are all of a rounded angle structure, which may be used to manufacture a special-shaped display panel with four angles all being of a rounded angle structure.

In some embodiments, the second concave-convex structure 133 and the fourth concave-convex structure 134 of the second strip plate 13 may also include an arc-shaped structure respectively at two ends thereof along the second direction, the structure and effect are similar as those described.

Figure 13:
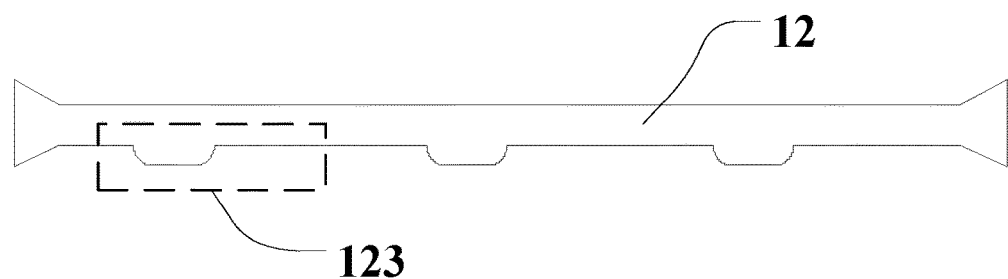
FIG. 13 is a structural schematic diagram of a first strip plate in a tenth embodiment of the present disclosure.

Please continue to refer to FIG. 13. In another embodiment, the first concave-convex structure 123 includes a raised structure in the middle of the first concave-convex structure 123 along the first direction.

It should be noted that, the expression "in the middle along the first direction" in the embodiment should be understood as the area, rather than the two ends, of the first concave-convex structure 123, and should not be understood as the exact middle of the first concave-convex structure 123, namely, it should not be understood that the lengths, along the first direction, of the first concave-convex structures 123 at two sides of the raised structure are the same. As to the first strip plate 12 as shown in FIG. 13, the raised structure of the first concave-convex structure 123 is not located in the exact middle of the first concave-convex structure 123. The special-shaped evaporation area 14 formed corresponding to the raised structure may form a groove at the side edge position, which may be used to manufacture a special-shaped display panel having a groove structure at the side edge. In some embodiments, the special-shaped display panel may be provided with a camera, a flashlight or an earphone and other structures at the position corresponding to the groove structure.

In some embodiments, the second concave-convex structure 124 in the above embodiment may also include a raised structure in the middle along the first direction, then in actual use, a groove may be arranged at the positions of opposite side edges of the evaporation area 14 constituted by two adjacent first strip plates 12, and a special-shaped display panel which may need to be provided with a groove structure at multiple sides may be manufactured.

In one embodiment, the third concave-convex structure 133 and the fourth concave-convex structure 134 of the second strip plate 13 may also respectively include a raised structure in the middle along the second direction, the structure and effect are the similar as those mentioned above and will not be repeated redundantly herein.

In a more preferred embodiment, the first concave-convex structure 123 of the first strip plate 12 may include an arc-shaped structure at two ends along the first direction, and include a raised structure in the middle, namely, a groove structure may be arranged at a side edge of the special-shaped display panel with a rounded angle structure. In one embodiment, the second concave-convex structure 124 may also include an arc-shaped structure at two ends along the first direction, and include a raised structure in the middle, such as the second concave-convex structure 124 as shown in FIG. 8.

The third concave-convex structure 133 and the fourth concave-convex structure 134 of the second strip plate 13 may also include an arc-shaped structure at two ends along the second direction, and include a raised structure in the middle.

Figure 9:
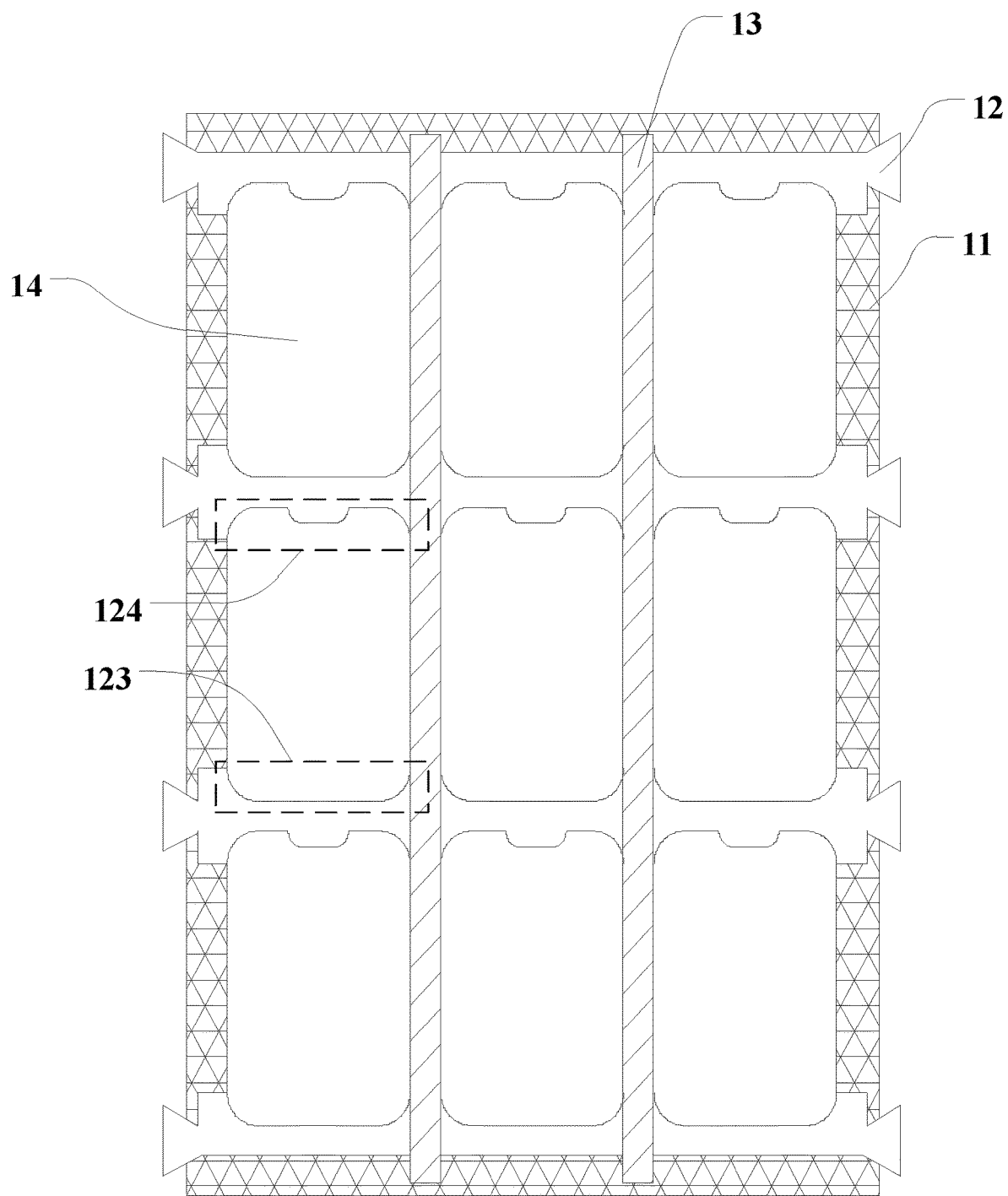
FIG. 9 is a structural schematic diagram of a mask device in a sixth embodiment of the present disclosure.
Figure 14:
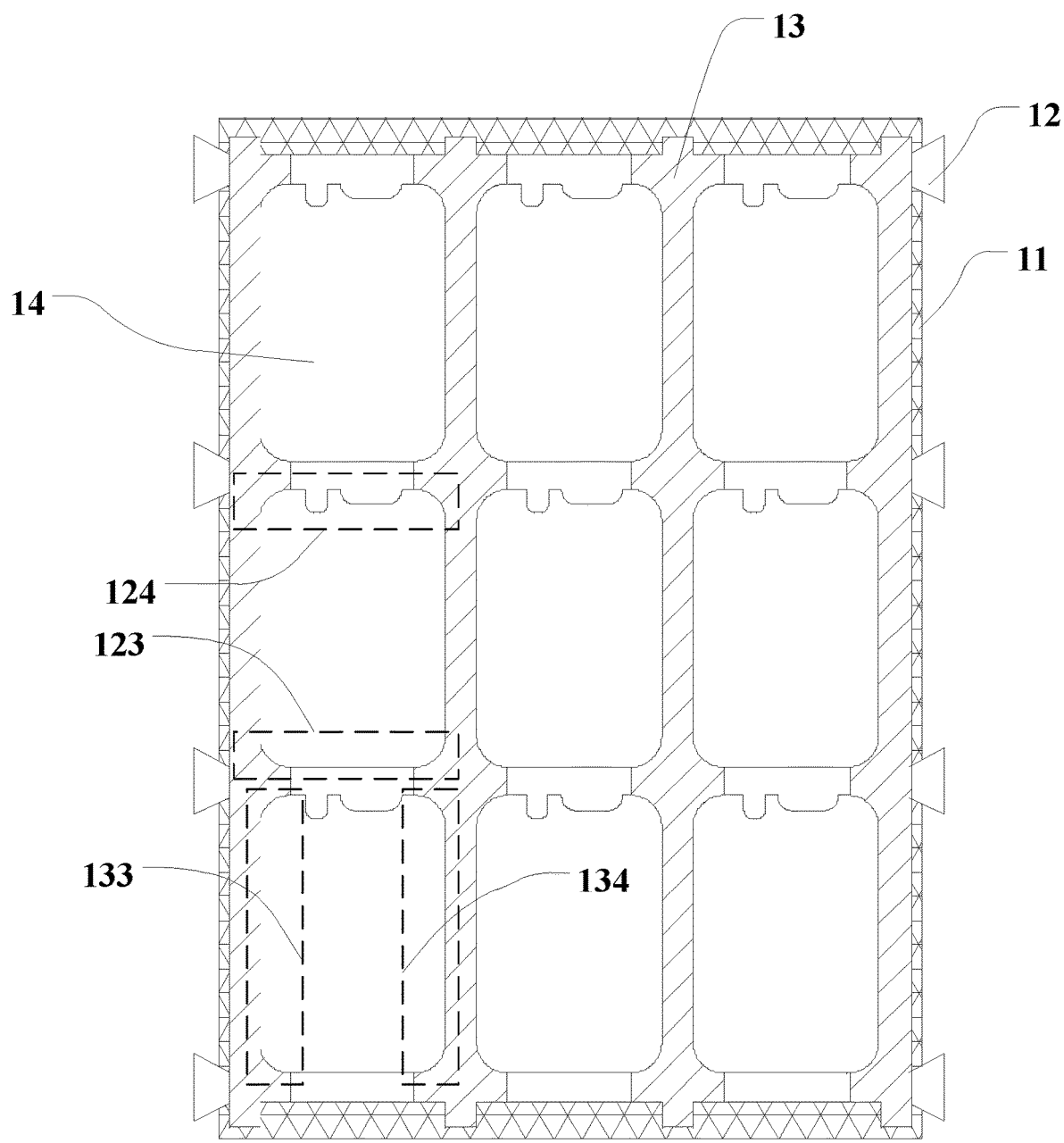
FIG. 14 is a structural schematic diagram of a mask device in an eleventh embodiment of the present disclosure.

In the specific embodiment, the shapes of the first strip plate 12 and the second strip plate 13 may be designed to match based on actual requirements, for example, as shown in FIG. 9, in a specific embodiment, in an evaporation area 14, the first concave-convex structure 123 of one first strip plate 12 may include an arc-shaped structure and a raised structure, while the second concave-convex structure 124 of another first strip plate 12 includes an arc-shaped structure, and the two second strip plates 13 both do not have a concave-convex structure, then a special-shaped display panel with a rounded angle and a groove may be formed, the groove may be used for arranging an earphone structure. Or, as shown in FIG. 14, in another specific embodiment, in an evaporation area 14, the first concave-convex structure 123 of the first strip plate 12 may include two convex structures with different sizes, the other first strip plate 12 does not include a second concave-convex structure 124, the third concave-convex structure 133 of one second strip plate 13 includes an arc-shaped structure, the fourth concave-convex structure 134 of another second strip plate 13 also includes an arc-shaped structure, and a display panel with a rounded angle and a groove may also be formed, the display panel in the embodiment may include two grooves, the two grooves may be respectively used for arranging an earphone structure and a camera structure.

Figure 15:
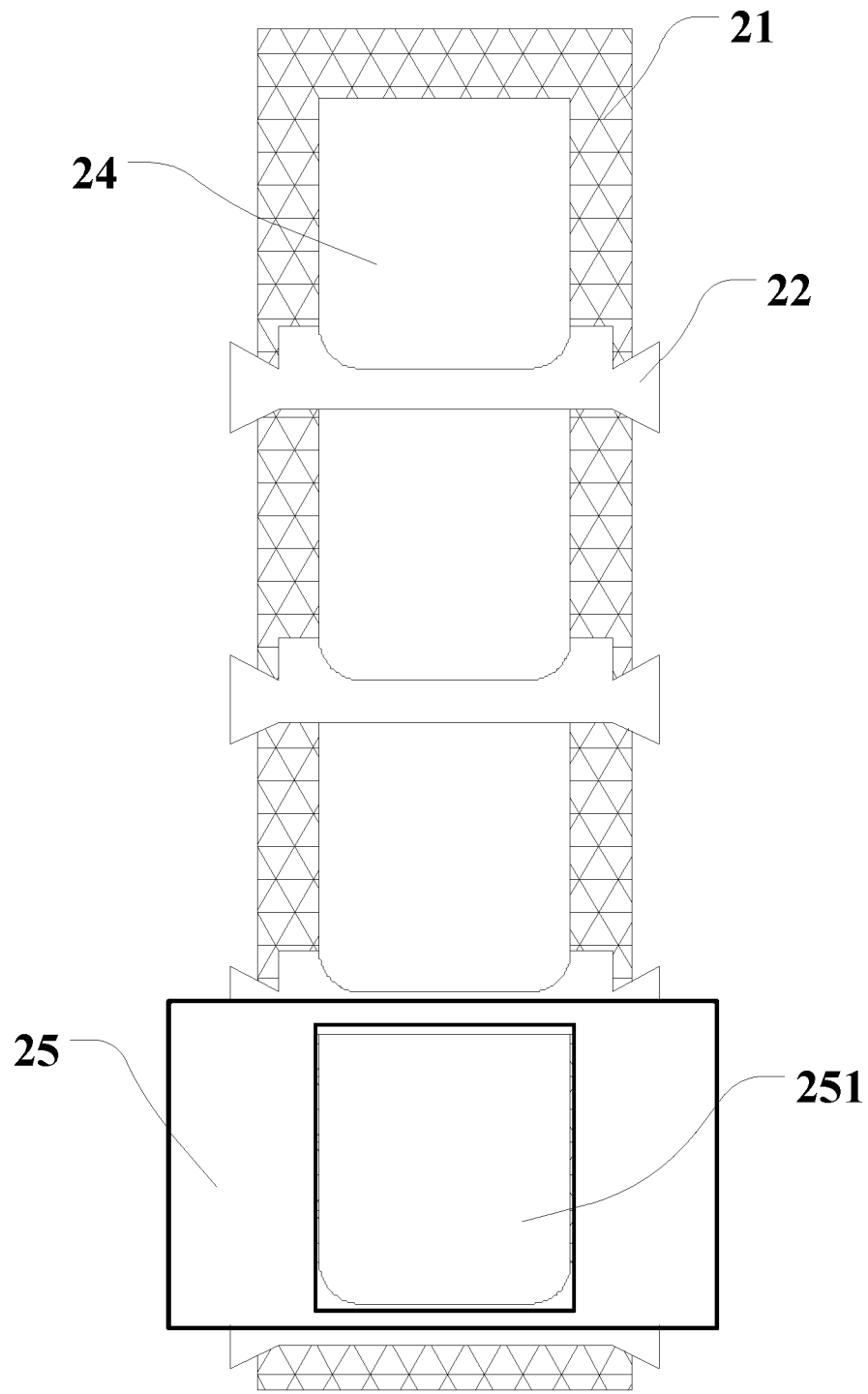
FIG. 15 is a structural schematic diagram of a mask device in a twelfth embodiment of the present disclosure.
Figure 16:
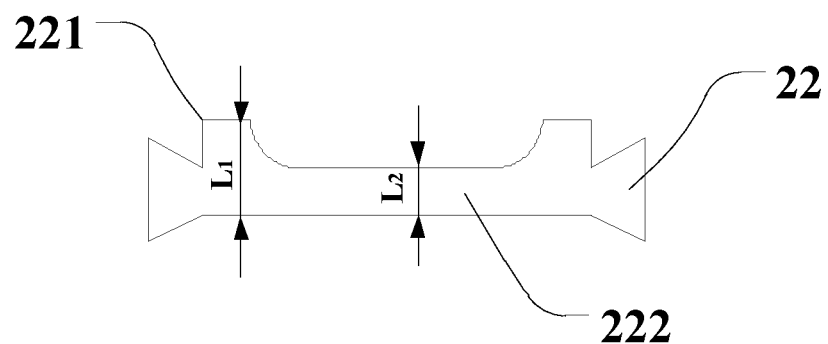
FIG. 16 is a structural schematic diagram of a first strip plate in a thirteenth embodiment of the present disclosure.

Please refer to FIG. 15 and FIG. 16. Another mask device provided by an embodiment of the present disclosure includes a framework 21, a first strip plate 22 and a first mask 25, where the first strip plate 22 is fixed on the framework 21 and extends along the first direction; the first mask 25 is located on a side, deviating from the framework 21, of the first strip plate 22, the first mask 25 includes at least one preset area, and the preset area includes at least one opening area 251.

The first strip plate 22 includes a first area 221 and a second area 222, and the width of the first area 221 is greater than the width of the second area 222 in the direction parallel to the surface of the first strip plate 22 and vertical to the first direction.

It shall be noted that, the mask device shown in FIG. 15 shows one first mask 25, and the remaining first masks 21 are omitted, so as to facilitate showing the framework 21 and the first strip plates 22.

In the embodiment, the first strip plate 22 of the mask device includes a first area 221 and a second area 222 which are of different widths. Referring now to FIG. 16, the width of the first area 221 of the first strip plate is $L_1$, the width of the second area 222 is $L_2$, and $L_1 > L_2$. In one embodiment, the shape of the first strip plate 22 may be designed based on the shape structure of the special-shaped display panel to be evaporated. The adjacent first strip plates 22 and the opening area 251 of the first mask 25 form a special-shaped evaporation area 24 to manufacture a special-shaped display panel. A special-shaped evaporation pattern may be formed through a one-time evaporation process by designing the position and shape of the first area 221 and the second area 222 reasonably, thus the efficiency of manufacturing the special-shaped display panel is higher.

In the embodiment, the opening areas 251 of the first mask 25 may be uniformly designed into a rectangle, and different special-shaped evaporation areas 24 may be formed by designing the shape of the first strip plates 22. Compared with the manufacturing of a special-shaped opening area on the first mask 25 for evaporating the special-shaped display panel, the present solution may simplify the structure of the first mask 25, and since the manufacturing cost of the first mask 25 is higher than that of the first strip plate 22, the present solution may further save costs.

Where the fixed manner between the first strip plate 22 and the framework 21 is not specifically limited, for example, the first strip plate 22 and the framework 21 may be connected in a welding or bonding manner, or may also be of an integrated structure.

Figure 17:
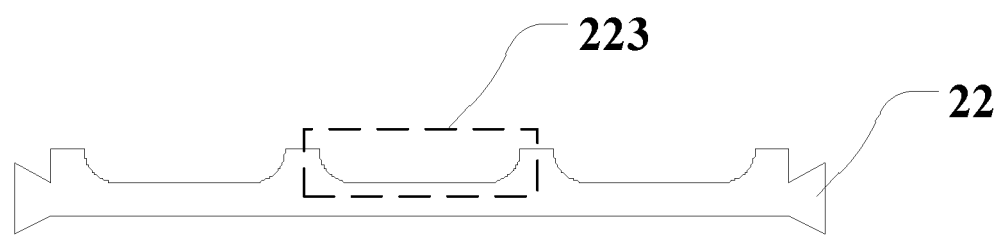
FIG. 17 is a structural schematic diagram of a first strip plate in a fourteenth embodiment of the present disclosure.
Figure 18:
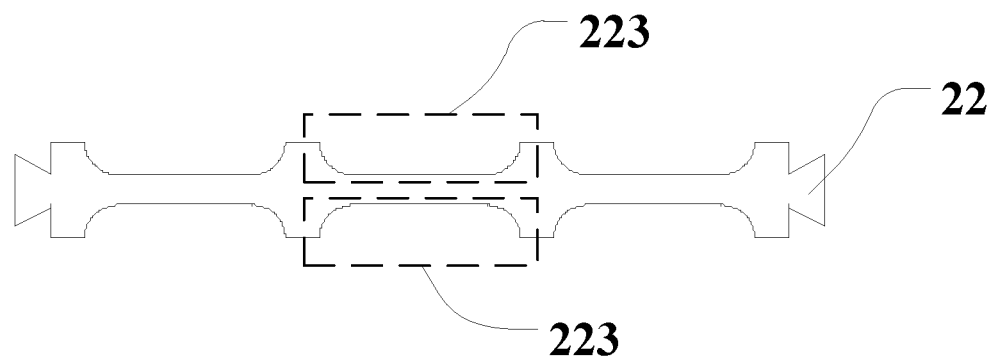
FIG. 18 is a structural schematic diagram of a first strip plate in a fifteenth embodiment of the present disclosure.

Please refer to FIG. 17 and FIG. 18. In one embodiment, the first strip plate 22 is provided with a first concave-convex structure 223 on a side edge along the first direction; and in the direction vertical to the surface of the first mask 25, the first concave-convex structure 223 of the first strip plate 22 covers at least part region of the at least one opening area 251 of the preset area.

In the embodiment, as shown in FIG. 17, the first strip plate 22 may be provided with a first concave-convex structure 223 on one side edge along the first direction, and may also be provided with a first concave-convex structure 223 on both side edges along the first direction as shown in FIG. 18. In one embodiment, when the two side edges of the first strip plate 22 are both provided with a first concave-convex structure 223, the first concave-convex structures 223 on the two side edges are arranged in mirror symmetry. The number of the first concave-convex structure 223 included in a side edge of each first strip plate 22 is not specifically limited, and may be one, two or more. In one embodiment, the numbers of concave parts and convex parts included in each first concave-convex structure 223 are also not specifically limited. And the first concave-convex structure 223 of the first strip structure as shown in FIG. 17 and FIG. 18 may be deemed to include two convex parts and one concave part. The first concave-convex structure 223 covers at least part region of the at least one opening area 251 of the preset area, then the first concave-convex structure 223 and the first mask 25 may together constitute a special-shaped evaporation area 24.

Figure 19:
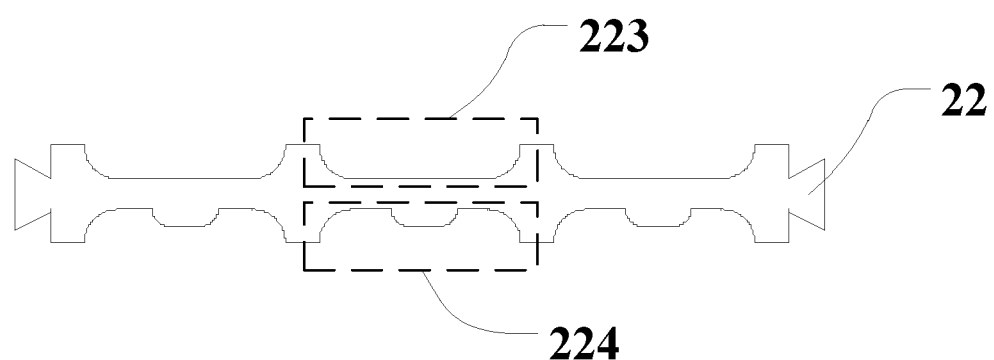
FIG. 19 is a structural schematic diagram of a first strip plate in a sixteenth embodiment of the present disclosure.

Please refer to FIG. 19. In one embodiment, the first strip plate 22 is provided with a first concave-convex structure 223 on one side edge along the first direction, and a second concave-convex structure 224 on the other side edge. In the direction vertical to the surface of the first mask 25, the second concave-convex structure 224 of the first strip plate 22 covers at least part region of the at least one opening area 251 of the preset area.

In the embodiment, the specific patterns of the first concave-convex structure 223 and the second concave-convex structure 224 may be the same and may also be different. Please refer to FIG. 20, in a specific application process, the first concave-convex structure 223 of one first strip plate 22 and the second concave-convex structure 224 of the adjacent first strip plate 22 correspond to two sides of the same special-shaped evaporation area 24, thereby constituting an entire special-shaped evaporation area 24. Therefore, the patterns of the first concave-convex structure 223 and the second concave-convex structure 224 may be made different based on requirements. The second concave-convex structure 24 covers at least part region of the at least one opening area 251 of the preset area, then the first concave-convex structure 223, the second concave-convex structure 224 and the first mask 25 may together constitute a special-shaped evaporation area 24.

Figure 20:
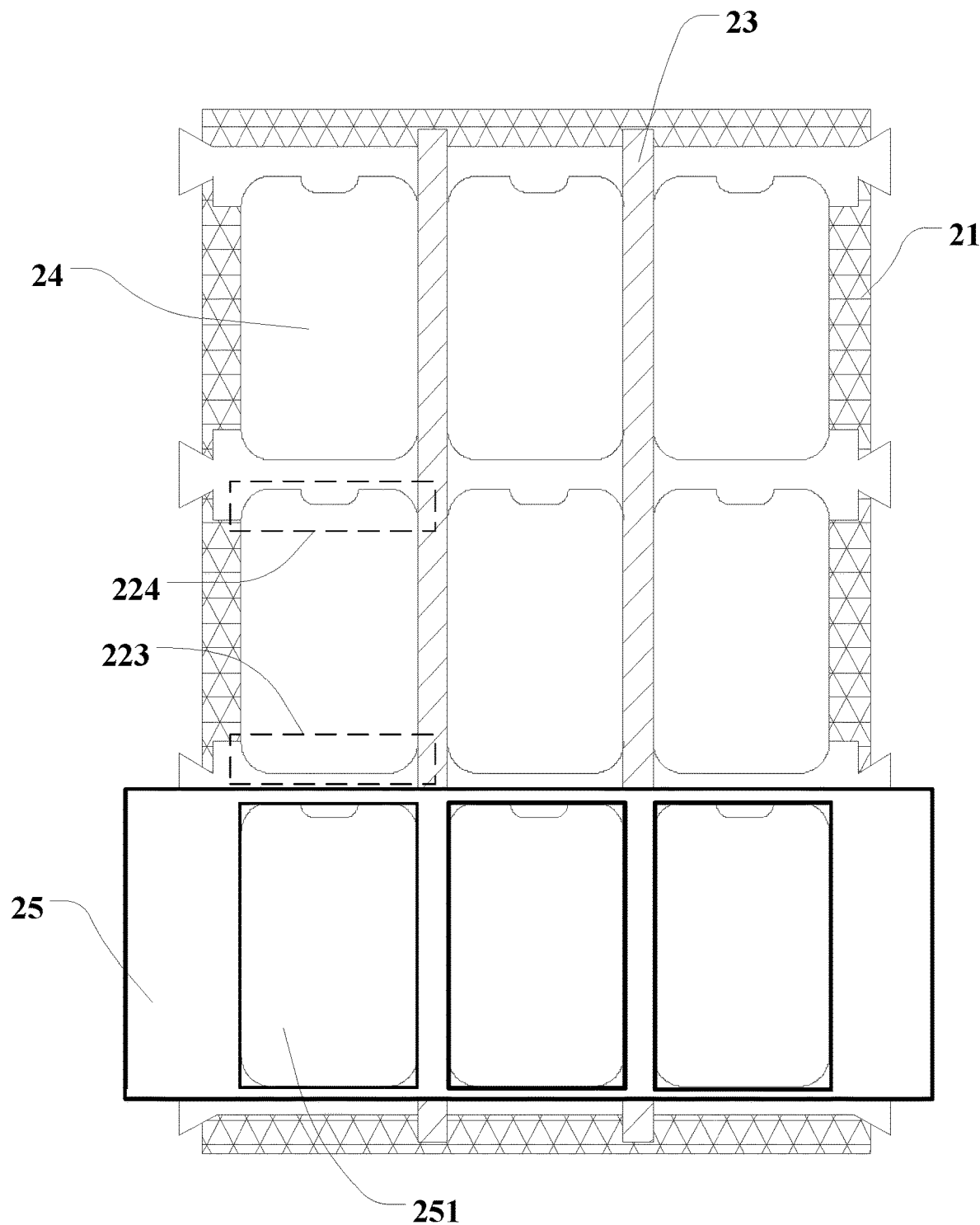
FIG. 20 is a structural schematic diagram of a mask device in a seventeenth embodiment of the present disclosure.

Please continue to refer to FIG. 20. In one embodiment, along the first direction, the first concave-convex structure 223 of the first strip plate 22 is in one-to-one correspondence to the preset area of the first mask 25.

In the embodiment, each preset area of the first mask 25 corresponds to a first concave-convex structure 223, such that each evaporation area 24 formed by the first mask 25 is a special-shaped evaporation area 24, and the evaporation products are maintained to be consistent. In addition, when the first strip plate 22 is provided with a second concave-convex structure 224, along the first direction, the second concave-convex structure 224 is also in one-to-one correspondence to the preset areas of the first mask 25.

Figure 21:
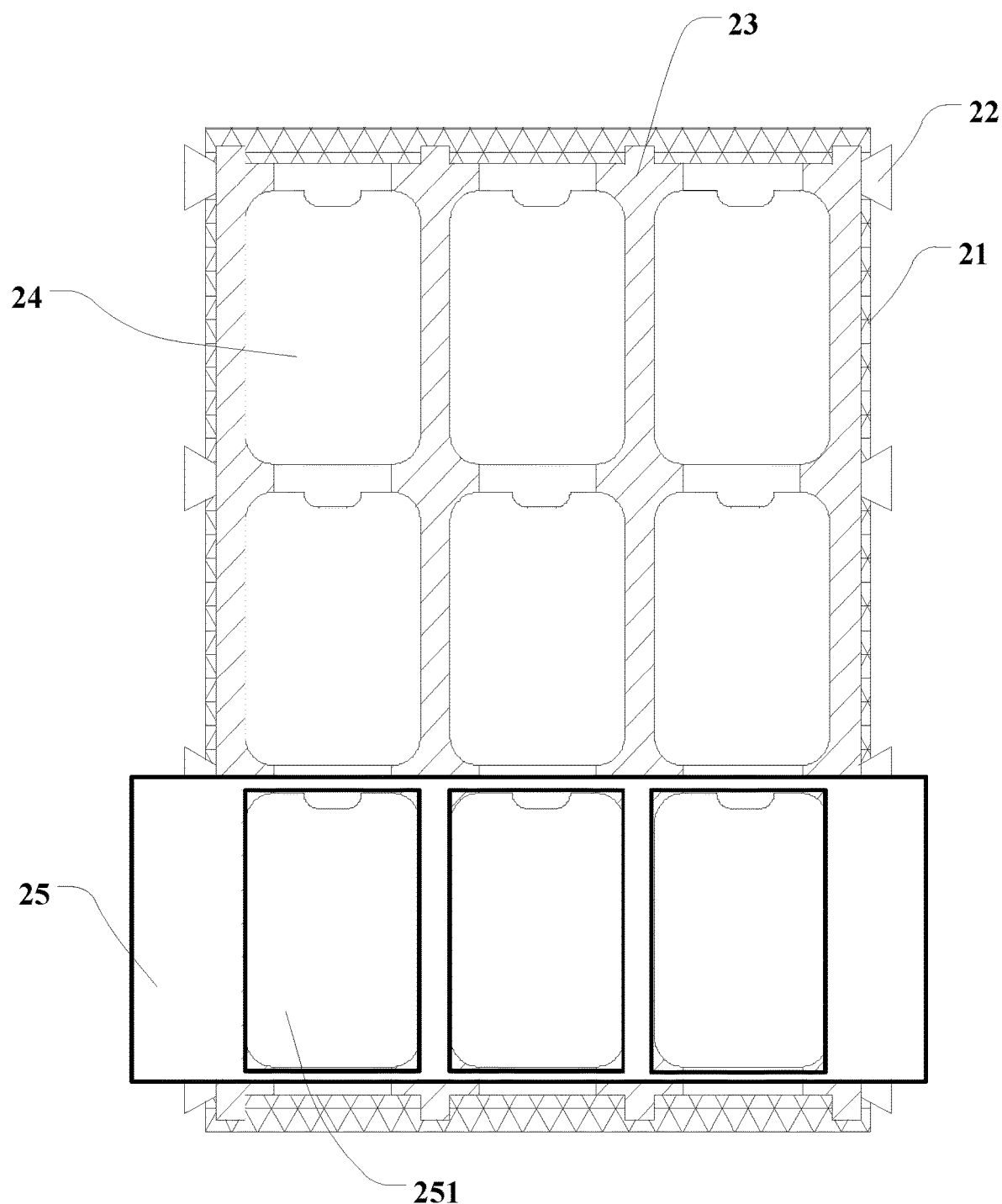
FIG. 21 is a structural schematic diagram of a mask device in an eighteenth embodiment of the present disclosure.
Figure 22:
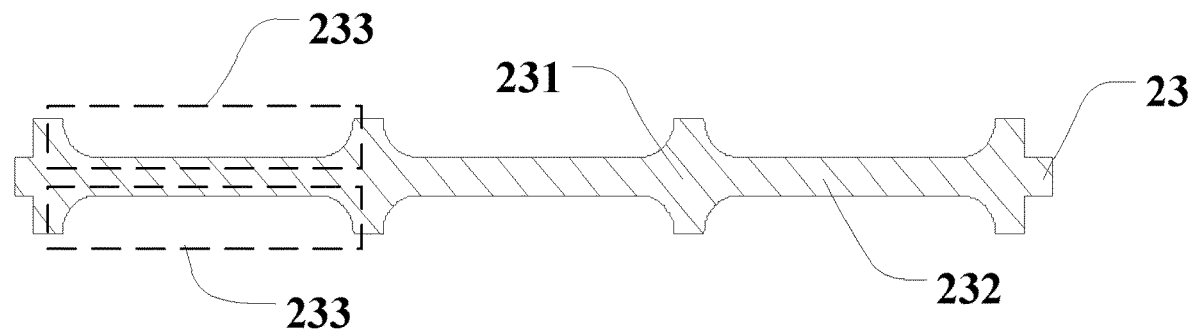
FIG. 22 is a structural schematic diagram of a second strip plate in a nineteenth embodiment of the present disclosure.

Please refer to FIG. 21 and FIG. 22, the mask device further includes a second strip plate 23 which is fixed on the framework 21, where the second strip plate 23 extends along the second direction, and the first direction is intersected with the second direction. The second strip plate 23 includes a third area 231 and a fourth area 232, where the width of the third area 231 is greater than the width of the fourth area 232 in the direction parallel to the surface of the second strip plate 23 and vertical to the second direction.

In the embodiment, the first strip plate 22 is intersected with the second strip plate 23 to form a special-shaped evaporation area 24 with the opening area 251 of the first mask 25, the second strip plate 23 includes a third area 231 and a fourth area 232 with different widths, then the shape of the second strip plate 23 may be designed according to the shape structure of the display panel to be evaporated. In the embodiment, the shapes of the first strip plate 22 and the second strip plate 23 may be adjusted based on product requirements, such that the periphery of the display panel may be designed with a special-shaped structure based on requirements, thereby improving the flexibility of the special-shaped display panel, and furthermore, the complex special-shaped evaporation patterns may also be manufactured through a one-step evaporation process, thereby further improving the efficiency of manufacturing the special-shaped display panel.

In some embodiments, the fixed manner between the second strip plate 23 and the first strip plate 22 as well as the framework 21 is also not limited, they may be connected in a welding or bonding manner or may be of an integrated structure; or the first strip plate 22 and the second strip plate 23 may be respectively welded with the framework 21, while the first strip plate 22 is connected with the second strip plate 23 in an inserting manner; or, the first strip plate 22 and the second strip plate 23 are integrally formed, and then the first strip plate 22 and the second strip 23 are welded with the framework 21, or the connection manner between each part may be designed based on the manufacturing process and the product requirements.

Please continue to refer to FIG. 22. The second strip plate 23 is provided with a third concave-convex structure 233 on a side edge along the second direction; and in the direction vertical to the surface of the first mask 25, the third concave-convex structure 233 of the second strip plate 23 covers at least part region of the at least one opening area 251 of the preset area.

In the embodiment, similar to the structure of the first strip plate 22, the second strip plate 23 may be provided with a third concave-convex structure 233 on one side edge along the second direction, and may also be provided with a third concave-convex structure 233 on both side edges along the second direction. In one embodiment, as shown in FIG. 22, when the two side edges of the second strip plate 23 are both provided with a third concave-convex structure 233, the third concave-convex structures 233 on the two side edges are arranged in mirror symmetry. The number of the third concave-convex structure 233 included in a side edge of each second strip plate 23 is not specifically limited, and may be one, two or more. In one embodiment, the numbers of concave parts and convex parts included in each third concave-convex structure 233 are also not specifically limited, and the second strip plate 23 as shown in FIG. 22 may be deemed to include two convex parts and one concave part.

Figure 23:
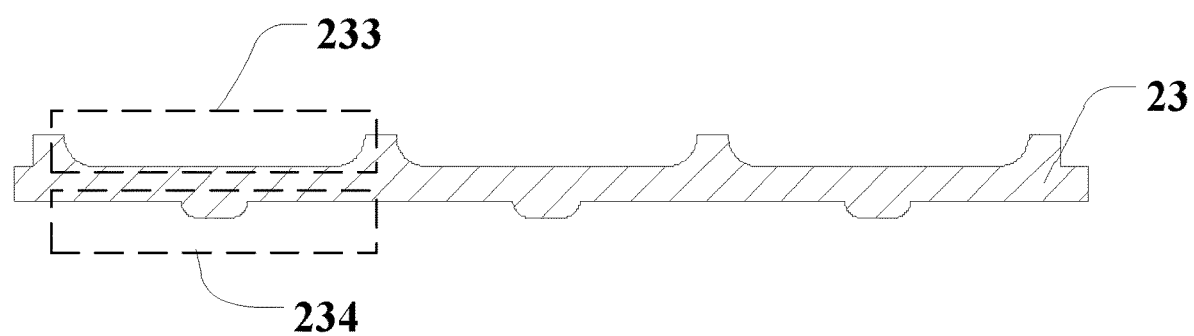
FIG. 23 is a structural schematic diagram of a second strip plate in a twentieth embodiment of the present disclosure.

Please refer to FIG. 23. In another embodiment, the second strip plate 23 is provided with a third concave-convex structure 233 on one side edge along the second direction, and a fourth concave-convex structure 234 on the other side edge. And in the direction vertical to the surface of the first mask 25, the fourth concave-convex structure 234 of the second strip plate 23 covers at least part region of the at least one opening area 251 of the preset area.

In the embodiment, the specific patterns of the third concave-convex structure 233 and the fourth concave-convex structure 234 may be the same and may also be different. As shown in FIG. 23, the specific patterns of the third concave-convex structure 233 and the fourth concave-convex structure 234 are different.

In a specific application process, the third concave-convex structure 233 of one second strip plate 23 and the fourth concave-convex structure 234 of an adjacent second strip plate 23 correspond to two sides of the same special-shaped evaporation area 24, furthermore, the third concave-convex structure 233 and the fourth concave-convex structure 234 as well as the first concave-convex structure 223 and the second concave-convex structure 224 of the first strip plate 22 may constitute an entire special-shaped evaporation pattern together. Therefore, the first concave-convex structure 223, the second concave-convex structure 224, the third concave-convex structure 233 and the fourth concave-convex structure 234 may be designed respectively according to requirements.

In another preferred embodiment, along the first direction, the third concave-convex structure 233 of the second strip plate 23 is in one-to-one correspondence to the preset area on the first mask 25.

In the embodiment, each preset area of the first mask 25 corresponds to the third concave-convex structure 233, such that each evaporation area 24 formed by the first strip plate 22, the second strip plate 23 and the first mask 25 is a special-shaped evaporation area 24, and the evaporation products are maintained to be consistent. In addition, when the second strip plate 23 is provided with a fourth concave-convex structure 234, along the second direction, the fourth concave-convex structure 234 is also in one-to-one correspondence to the preset areas on the first mask 25.

Please continue to refer to FIG. 21. In one embodiment, the mask device includes multiple first strip plates 22 and multiple second strip plates 23, the first strip plates 22 and the second strip plates 23 are intersected with each other to define a hollow area, and the hollow area is opposite to the at least one preset area on the first mask 25.

In the embodiment, the first strip plates 22 and the second strip plates 23 are both multiple in number, then multiple hollow areas opposite to the special-shaped evaporation area 24 may be defined, the hollow area is opposite to the opening area 251 of the first mask 25 to form a special-shaped evaporation area 24, then multiple special-shaped display panels may be evaporated in a one-time evaporation process by utilizing the mask device, and the efficiency of manufacturing the special-shaped display panel may be further improved.

In one embodiment, the first strip plate 22 and the second strip plate 23 are integrally formed. Then the integrated first strip plate 22 and second strip plate 23 may be fixed on the framework 21, therefore, the efficiency of manufacturing the mask device may be improved, the integrality of the mask device may be improved, and further the evaporation effect of evaporation by utilizing the mask device may be improved.

Please refer to FIG. 17. In an embodiment, the first concave-convex structure 223 is provided with an arc-shaped structure at two ends along the first direction.

In some embodiments, the arc-shaped structure in the embodiment is a concave arc structure, and the special-shaped evaporation area 24 formed correspondingly may form a rounded angle in the angular position, so as to manufacture a special-shaped display panel with a rounded angle structure. In some embodiments, please refer to FIG. 19, the second concave-convex structure 224 in the above embodiment may also include an arc-shaped structure at two ends along the first direction. In actual application, please refer to FIG. 20, the four angular positions of the evaporation area 24 constituted by two adjacent first strip plates 22 are all of a rounded angle structure, and a special-shaped display panel with the four angles all being of a rounded angle structure may be manufactured.

In one embodiment, the second concave-convex structure 233 and the fourth concave-convex structure 234 of the second strip plate 23 may also include an arc-shaped structure respectively at two ends thereof along the second direction, the structure and effect are similar as those described above and will not be repeated redundantly herein.

Figure 24:
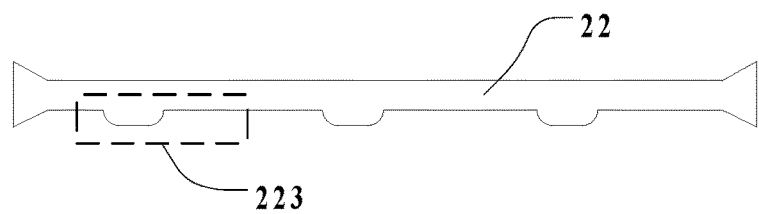
FIG. 24 is a structural schematic diagram of a first strip plate in a twenty-first embodiment of the present disclosure.

Please continue to refer to FIG. 24. In another embodiment, the first concave-convex structure 223 includes a raised structure in the middle along the first direction.

It shall be noted that, the "in the middle along the first direction" in the embodiment should be understood as the area, rather than the two ends, of the first concave-convex structure 223, and should not be understood as the exact middle of the first concave-convex structure 223, namely, it should not be understood that the lengths, along the first direction, of the first concave-convex structures 223 at two sides of the raised structure are the same. As to the first strip plate 23 as shown in FIG. 24, the raised structure of the first concave-convex structure 223 is not located in the exact middle of the first concave-convex structure 223. The special-shaped evaporation area 24 formed corresponding to the raised structure may form a groove at a side edge position, so as to manufacture a special-shaped display panel having a groove structure at a side edge. In some embodiments, the special-shaped display panel may be provided with a camera, a flashlight or an earphone and other structures at the position corresponding to the groove structure.

In some embodiments, the second concave-convex structure 224 in the above embodiment may also include a raised structure in the middle along the first direction, then in actual use, a groove may be arranged at the positions of opposite side edges of the evaporation area 24 constituted by two adjacent first strip plates 22, and a special-shaped display panel which may need to be provided with a groove structure at multiple sides may be manufactured.

In one embodiment, the third concave-convex structure 233 and the fourth concave-convex structure 234 of the second strip plate 23 may also respectively include a raised structure in the middle along the second direction, the structure and effect are similar as those mentioned above and will not be repeated redundantly herein.

In a more preferred embodiment, the first concave-convex structure 223 of the first strip plate 22 may include an arc-shaped structure at two ends along the first direction, and include a raised structure in the middle, namely, a groove structure may be arranged at the side edge of the special-shaped display panel with a rounded angle structure. In one embodiment, the second concave-convex structure 224 may also include an arc-shaped structure at two ends along the first direction, and include a raised structure in the middle, such as the second concave-convex structure 224 as shown in FIG. 19.

The third concave-convex structure 233 and the fourth concave-convex structure 234 of the second strip plate 23 may also include an arc-shaped structure at two ends along the second direction, and include a raised structure in the middle.

Figure 25:
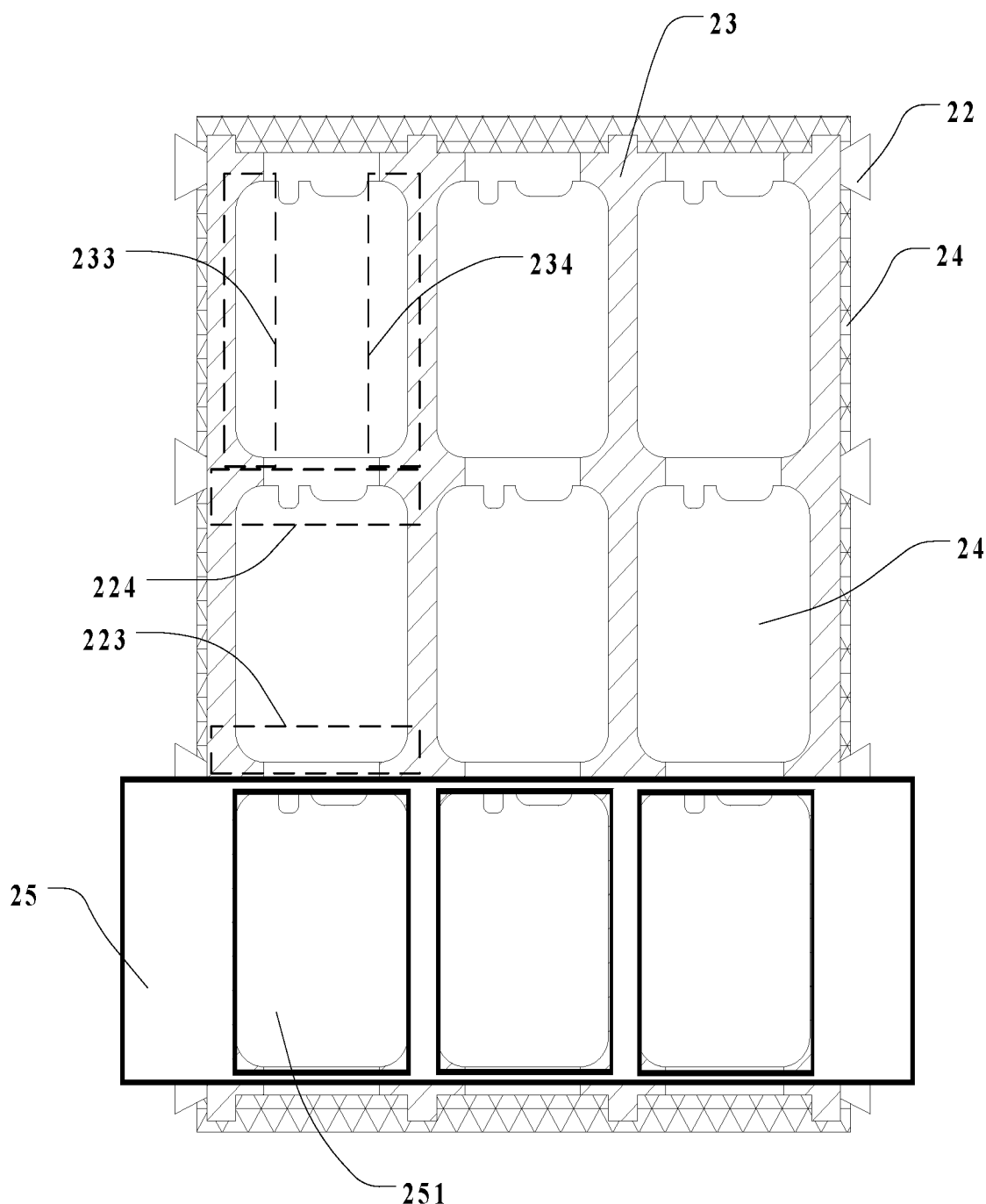
FIG. 25 is a structural schematic diagram of a mask device in a twenty-second embodiment of the present disclosure.

In the specific embodiment, the shapes of the first strip plate 22 and the second strip plate 23 may be designed to match based on actual requirements, for example, as shown in FIG. 20, in a specific embodiment, in an evaporation area 24, the first concave-convex structure 223 of one first strip plate 22 may include an arc-shaped structure and a raised structure, while the second concave-convex structure 224 of another first strip plate 22 includes an arc-shaped structure, and the two second strip plates 23 both do not have a concave-convex structure, then a special-shaped display panel with a rounded angle and a groove may be formed, the groove may be used for arranging an earphone structure. Or, as shown in FIG. 25, in another specific embodiment, in an evaporation area 24, the first concave-convex structure 223 of the first strip plate 22 may include two convex structures with different sizes, the other first strip plate 22 does not include a second concave-convex structure 224, the third concave-convex structure 233 of one second strip plate 23 includes an arc-shaped structure, the fourth concave-convex structure 234 of another second strip plate 23 also includes an arc-shaped structure, and a display panel with a rounded angle and a groove may also be formed, the special-shaped display panel manufactured in the embodiment may include two groove structures, the two groove structures may be respectively used for arranging an earphone structure and a camera structure.

In the embodiment of the present disclosure, the type of the first mask 25 is not specifically limited, for example, the first mask 25 is a common mask, the preset area includes one opening area 251. The mask device may be used as a common mask (CMM for short), and the efficiency of manufacturing the special-shaped display panel is improved.

In another embodiment, the first mask 25 is a fine metal mask, and the preset area of the first mask 25 includes multiple opening areas 251.

The mask device may be used as a Fine Metal Mask (FMM for short), for example, the mask device may be used for evaporating the emitting layer of the display panel. The manufacturing cost of the fine metal mask is higher, when each fine metal mask is manufactured, analogue simulation may need to be conducted, and corresponding molds may need to be manufactured. If patterns are manufactured on the fine metal mask to form a special-shaped evaporation area 24, a fine metal mask corresponding to each type of display panel may need to be designed, and a mold may need to be manufactured, therefore, the cost is high and the time consumption is long. While the first strip plate 22 and the second strip plate 23 are low in cost and simple in manufacturing process, therefore, the present solution may not only improve the efficiency of manufacturing the special-shaped display panel, but also reduce the manufacturing cost of the special-shaped display panel.

Please continue to refer to FIG. 25. The first mask 25 extends along the second direction, the mask device comprises multiple first masks 25, the respective first masks 25 are respectively located between two adjacent second strip plates 23, and the first strip plate 22 is located between the second strip plate 23 and the first mask 25.

In the embodiment, the first strip plate 22 may be used for supporting the first mask 25, such that the first mask 25 may be maintained to be flat, the middle of the first mask 25 is not easily sunk, then the space between the first mask 25 and the evaporation target may be maintained to be constant, so that the thickness of the evaporated film is even and the quality of the evaporated film is improved.

In one embodiment, the thickness of the first strip plate 22 is greater than the thickness of the second strip plate 23. Since the first strip plate 22 is in contact with the first mask 25 to support the first mask 25, then the first strip plate 22 may need to possess a certain rigidity to better support the first mask 25, therefore, the thickness of the first strip plate 22 should be greater. While the second strip plate 23 mainly plays a role of manufacturing a set evaporation pattern, therefore, no higher requirement is proposed for the rigidity of the second strip plate 23, the thickness of the second strip plate 23 may be designed to be thinner, and when the thickness is designed to be thinner, the space between the first mask 25 and the evaporation target may be shortened, then a shadow area which is formed by the entering of the evaporation material from the gap between the first mask 25 and the evaporation target into the non-evaporation area may be reduced, and the quality of the evaporated film may be further improved.

Through numerous calculations and analysis, the inventor believed that in an embodiment, the thickness of the first strip plate is in a range of 50 μm~200 μm, and the thickness of the second strip plate is in a range of 20 μm~40 μm. For example, the thickness of the first strip plate may be selected to be: 55 μm, 58 μm, 60 μm, 65 μm, 70 μm, 74 μm, 78 μm, 80 μm, 85 μm, 90 μm, 95 μm, 98 μm, 100 μm, 110 μm, 120 μm, 124 μm, 125 μm, 130 μm, 136 μm, 140 μm, 145 μm, 150 μm, 155 μm, 160 μm, 170 μm, 180 μm or 190 μm, etc. The selection of specific thickness of the first strip plate 22 may be considered comprehensively based on the size and quality of the supported first mask and the remaining sizes and selection of materials of the first strip plate. The thickness of the second strip plate may be selected to be: 22 μm, 25 μm, 28 μm, 30 μm, 31 μm, 34 μm, 35 μm or 38 μm, etc. The thickness of the second strip plate may also be selected based on the overall size and texture of the mask device.

Figure 26:
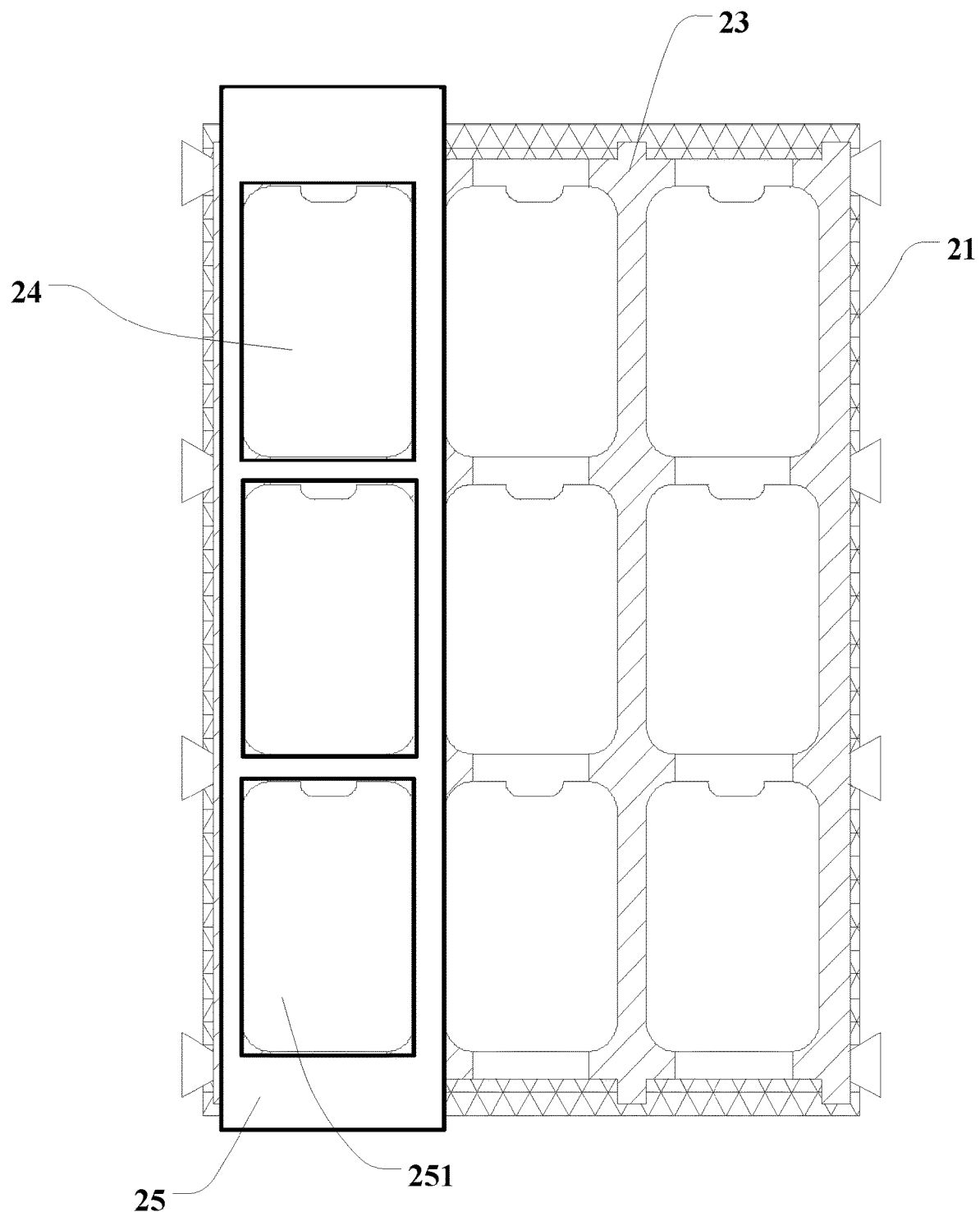
FIG. 26 is a structural schematic diagram of a mask device in a twenty-third embodiment of the present disclosure.

Please refer to FIG. 26. In another specific embodiment, the first mask 25 may extend along the second direction. In the embodiment, respective first masks 25 are respectively located between two adjacent first strip plates 22, and the second strip plate 23 is located between the first strip plate 22 and the first mask 25. In the embodiment, the second strip plate 23 plays a role of supporting the first mask 25, and more preferably, the thickness of the second strip plate 23 is greater than the thickness of the first strip plate 22, so as to ensure the support effect of the second strip plate 23.

In one embodiment, the mean thermal expansion coefficient of the first strip plate and the first mask under room temperature is less than $15 \times 10^{-6}/°$ C. In a specific application, the mean thermal expansion coefficient of the first strip plate and the first mask under room temperature should be designed to be small, so as to ensure the stability of the shape of the mask device, and prevent the mask device from being deformed. If the mask device is deformed, the shape of the evaporation area will be changed, then the quality of the evaporated product will be reduced, and even the problem of evaporation failure will be brought about.

Preferably, the material of the first strip plate and the first mask is iron-nickel alloy. The iron-nickel alloy is favorable in rigidity and is not easily deformed, therefore, the iron-nickel alloy is preferably used to manufacture the mask device.

Figure 27:
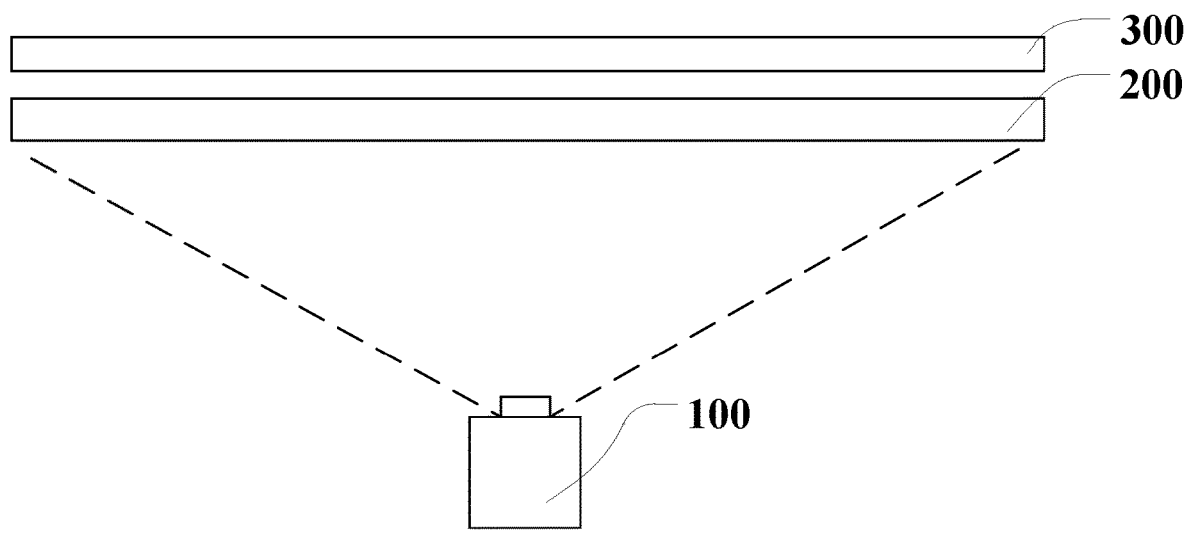
FIG. 27 is a structural schematic diagram of an evaporation device in a twenty-fourth embodiment of the present disclosure.

An embodiment of the present disclosure further provides an evaporation device which includes an evaporation source and a mask device, as shown in FIG. 27 which is a schematic diagram of the evaporation device provided by the embodiment of the present disclosure. Where the evaporation device includes an evaporation source 100 and a mask device 200, and the mask device is the mask device in any of the above technical solutions. Where the evaporation source 100 sends evaporation substances towards the mask device 200, and the evaporation substances are evaporated to evaporation targets 300 through the mask device.

In a specific embodiment, a special-shaped display panel may be manufactured by adopting the evaporation device in the embodiment of the present disclosure, namely, the display panel is used as an evaporation target for evaporation, and the manufacturing of the evaporation film of the special-shaped display panel may be finished through a one-time evaporation process, therefore, the efficiency of manufacturing the special-shaped display panel by adopting the evaporation device in the embodiment is higher.

What is claimed is:

1. A mask module, comprising:
 a framework;
 at least one first strip plate fixed on the framework and extending along a first direction; and
 a first mask located on a side, deviating from the framework, of the at least one first strip plate, the first mask including at least one preset area, and the at least one preset area including at least one opening, wherein:
 the at least one first strip plate is provided with a first concave-convex structure on one side edge of the at least one first strip plate along the first direction;
 at least one raised structure is provided in a middle position of the first concave-convex structure along the first direction;
 in a direction perpendicular to a surface of the first mask, the first concave-convex structure and the at least one raised structure cover at least a first part of an area of the at least one opening of the at least one preset area; and the at least one raised structure and the first strip plate are integrally formed.

2. The mask module of claim 1, wherein:

the at least one first strip plate includes a first area and a second area; and in a second direction parallel to a contact surface of the at least one first strip plate and the frame and perpendicular to the first direction, a width of the first area is greater than a width of the second area.

3. The mask module of claim 1, wherein:

a second concave-convex structure is provided on another side edge of the at least one first strip plate; and in a direction perpendicular to the surface of the first mask, the second concave-convex structure of the at least one first strip plate covers at least a second part of the area of the at least one opening of the at least one preset area.

4. The mask module of claim 1, further comprising at least one second strip plate fixed on the framework, wherein:

the at least one second strip plate extends along a second direction, and the first direction is intersected with the second direction;

a third concave-convex structure is provided on a side edge of the at least one second strip plate along the second direction; and in a direction perpendicular to the surface of the first mask, the third concave-convex structure covers a second part of the area of the at least one opening of the at least one preset area.

5. The mask module of claim 4, wherein the at least one second strip plate includes a third area and a fourth area, a width of the third area being greater than a width of the fourth area in a direction parallel to a surface of the at least one second strip plate and perpendicular to the second direction.

6. The mask module of claim 4, wherein:

a fourth concave-convex structure is provided on another side edge of the at least one second strip plate; and in a direction perpendicular to the surface of the first mask, the fourth concave-convex structure of the at least one second strip plate covers at least a third part of the area of the at least one opening of the at least one present area.

7. The mask module of claim 6, wherein the third concave-convex structure and the fourth concave-convex structure have different patterns.

8. The mask module of claim 4, wherein the at least one first strip plate includes a plurality of first strip plates and the at least one second strip plate includes a plurality of second strip plates, wherein:

the plurality of first strip plates and the plurality of second strip plates intersect with each other to define a hollow area; and the hollow area faces the at least one preset area of the first mask.

9. The mask module of claim 4, wherein the at least one first strip plate and the at least one second strip plate are formed integrally.

10. The mask module of claim 4, wherein a thickness of the at least one first strip plate is greater than a thickness of the at least one second strip plate.

11. The mask module of claim 1, wherein the first concave-convex structure includes an arc-shaped structure at two ends of the first concave-convex structure along the first direction.

12. The mask module of claim 1, wherein the raised structure includes an arc-shaped structure at two ends of the raised structure along the first direction.

13. The mask module of claim 1, wherein:

the raised structure is symmetrical along a first axis of symmetry in a second direction;

the first concave-convex structure is symmetrical along a second axis of symmetry in the second direction; and the first direction intersects with the second direction.

14. The mask module of claim 13, wherein the first axis of symmetry coincides with the second axis of symmetry.

15. The mask module of claim 1, wherein the first concave-convex structure includes two convex structures with different dimensions.

16. The mask module of claim 1, wherein the raised structure and the at least one first strip plate are made of a same material.

17. An evaporation device, comprising an evaporation source; and a mask module including:

a framework;

at least one first strip plate fixed on the framework and extending along a first direction; and a first mask located on a side, deviating from the framework, of the at least one first strip plate, the first mask including at least one preset area, and the at least one preset area including at least one opening;

wherein:

the at least one first strip plate is provided with a first concave-convex structure on one side edge of at least one first strip plate along the first direction;

at least one raised structure is provided in a middle of the first concave-convex structure along the first direction;

in a direction perpendicular to a surface of the first mask, the first concave-convex structure and the raised structure cover at least a first part of an area of the at least one opening of the at least one preset area;

the raised structure and the first strip plate are integrally formed; and the evaporation source sends evaporation substances towards the mask module, and the evaporation substances are evaporated to evaporation targets through the mask module.

18. The evaporation device of claim 17, wherein:

the at least one first strip plate includes a first area and a second area; and in a second direction parallel to a contact surface of the at least one first strip plate and the frame and perpendicular to the first direction, a width of the first area is greater than a width of the second area.

19. The evaporation device of claim 17, wherein:

a second concave-convex structure is provided on another side edge of the at least one first strip plate; and in a direction perpendicular to the surface of the first mask, the second concave-convex structure of the at least one first strip plate covers at least a second part of the area of the at least one opening of the at least one preset area.

20. A mask module, comprising:

a framework;

at least one first strip plate fixed on the framework and extending along a first direction; and a first mask located on a side, deviating from the framework, of the at least one first strip plate, the first mask including at least one preset area, and the at least one preset area including at least one opening, wherein:

the at least one first strip plate is provided with at least one first concave-convex structure on one side edge of the at least one first strip plate along the first direction;

at least one raised structure is provided in a middle position of each of the at least one first concave-convex structure integrally along the first direction; and in a direction perpendicular to a surface of the first mask, the at least one first concave-convex structure and the at least one raised structure cover at least a first part of an area of the at least one opening of the at least one preset area, and wherein the at least one raised structure is located in a same position in the at least one opening of adjacent two preset areas of the at least one preset area.

\* \* \* \* \*